(12) United States Patent
Kubota et al.

(10) Patent No.: US 7,794,563 B2
(45) Date of Patent: Sep. 14, 2010

(54) ETCHING DEPTH MEASURING DEVICE, ETCHING APPARATUS, AND ETCHING DEPTH MEASURING METHOD

(75) Inventors: Naoki Kubota, Tokyo (JP); Akihiro Horita, Tokyo (JP)

(73) Assignee: TDK Corporation, Tokyo (JP)

( * ) Notice: Subject to any disclaimer, the term of this patent is extended or adjusted under 35 U.S.C. 154(b) by 952 days.

(21) Appl. No.: 11/445,134

(22) Filed: Jun. 2, 2006

(65) Prior Publication Data
US 2007/0045228 A1   Mar. 1, 2007

(30) Foreign Application Priority Data
Jun. 8, 2005   (JP)   ............ P2005-168545

(51) Int. Cl.
  H01L 21/00   (2006.01)
  C23C 16/00   (2006.01)
  C23C 14/00   (2006.01)
(52) U.S. Cl. ............... 156/345.24; 156/345.25; 156/345.26; 204/192.13; 204/298.32
(58) Field of Classification Search ............ 156/345.24, 156/345.25, 345.26; 118/712; 204/192.1, 204/298.01, 192.13, 298.32
See application file for complete search history.

(56) References Cited

U.S. PATENT DOCUMENTS 5,055,318 A * 10/1991 Deutchman et al. ......... 427/534
5,966,586 A   10/1999 Hao

FOREIGN PATENT DOCUMENTS

| JP | U-63-55535 |   | 4/1988 |
| JP | 01161650 A | * | 6/1989 |
| JP | A6-94427 |   | 4/1994 |

* cited by examiner

Primary Examiner—Ram N. Kackar
(74) Attorney, Agent, or Firm—Oliff & Berridge, PLC

(57) ABSTRACT

An etching depth measuring device for measuring the etching depth of an object to be processed, when etching the object to be processed by using active species present in a plasma, the etching depth measuring device comprising: a chamber in which is formed an introduction port for introducing a part of the active species; a member to be processed which is housed in the chamber and etched by the part of the active species; and a mass detecting element which receives a substance generated from the member to be processed and detects the mass of the received substance.

13 Claims, 7 Drawing Sheets

ETCHING DEPTH MEASURING DEVICE, ETCHING APPARATUS, AND ETCHING DEPTH MEASURING METHOD

BACKGROUND OF THE INVENTION

1. Field of the Invention

The present invention relates to an etching depth measuring device, etching apparatus, and etching depth measuring method.

2. Related Background Art

An ion beam etching apparatus (also referred to as "ion milling apparatus") usually etches an object to be processed, which is made from one type of material. When etching such an object to be processed, it is required that etching be stopped when desired etching depth is reached. However, an etching end point detection device of the plasma emission spectrometer system, which is used in a dry etching apparatus as semiconductor manufacturing equipment, cannot be used, thus normally the correlation between etching time and etching depth is used to predict etching depth from etching time.

As a method of measuring etching depth, the method described in Japanese Patent Application Laid-Open No. H6-94427 is known. This publication describes an ion beam etching apparatus in which the ions in a plasma are injected into an object to be processed, and thereby groove processing is performed. In this ion beam etching apparatus, at the same time when groove processing is carried out, a laser beam is irradiated as S polarized light or P polarized light via a polarization window onto the object to be processed, and zeroth or first diffracted light is detected from the object to be processed, whereby the depth of the grooves which are formed on the object to be processed can be measured continuously.

SUMMARY OF THE INVENTION

However, in the abovementioned ion beam etching apparatus, since particles which are generated from the object to be processed due to etching processing accumulate on the polarization window, the laser beam is blocked by these accumulated particles. For this reason, the accuracy of detecting the depth of a groove is reduced and long-term stable measurement becomes difficult. Specifically, several times of measurement smears the polarization window, making the measurement difficult.

The present invention is contrived in view of such circumstances, and the object thereof is to provide an etching depth measuring device, etching apparatus, and etching method with which the etching depth of an object to be processed can be measured stably in the long term.

In order to solve the above problems, the etching depth measuring device of the present invention is an etching depth measuring device for measuring an etching depth of an object to be processed, when etching the object to be processed by using active species present in a plasma, the etching depth measuring device comprising: a chamber in which is formed an introduction port for introducing a part of the active species; a member to be processed which is housed in the chamber and etched by the part of the active species; and a mass detecting element which receives a substance generated from the member to be processed and detects mass of the received substance.

It is preferred that the mass detecting element comprise a member in which the resonance frequency changes in response to a change in the mass of the received substance, and a sensor which detects the resonance frequency of the member.

Further, it is preferred that the mass detecting element comprise a mass spectrometer which detects the mass of the received substances.

It is preferred that the etching depth measuring device comprise an angle adjusting section which supports the member to be processed and adjusts an angle of incidence at which the part of the active species diffuses to the member to be processed.

Furthermore, it is preferred that a speed of etching the member to be processed be higher than a speed of etching the object to be processed.

Moreover, it is preferred that the etching depth measuring device further comprise an energy adjusting section for adjusting the energy of the part of the active species.

Further, it is preferred that the energy adjusting section comprise an electrode section provided on a circumference of the introduction port.

In addition, it is preferred that the electrode section comprise a first electrode and a second electrode which is disposed between the first electrode and the member to be processed.

Moreover, it is preferred that the energy adjusting section comprise a power source which is electrically connected to the member to be processed.

Also, it is preferred that the chamber comprise a discharge port for discharging the substance generated from the member to be processed, that the mass detecting element be provided outside the chamber, and that the etching depth measuring device further comprise a pipe for connecting the discharge port to the mass detecting element.

The etching apparatus of the present invention comprises an etching depth measuring device for measuring etching depth of an object to be processed, when etching the object to be processed by using active species present in a plasma, wherein the etching depth measuring device comprises: a chamber in which is formed an introduction port for introducing a part of the active species; a member to be processed which is housed in the chamber and etched by the part of the active species; and a mass detecting element which receives a substance generated from the member to be processed and detects mass of the received substance.

The etching depth measuring method of the present invention is an etching depth measuring method for measuring the etching depth of an object to be processed, when etching the object to be processed by using active species present in a plasma, the method comprising the steps of: (a) etching the object to be processed and etching a member to be processed by using a part of the active species; (b) receiving a substance generated from the etched member to be processed using a mass detecting element, and detecting mass of the received substance; and (c) calculating the etching depth of the object to be processed by using a relational expression between the detected mass of the substance and etching depth of the object to be processed calculated in advance.

DESCRIPTION OF THE PREFERRED EMBODIMENTS

Figure 1:
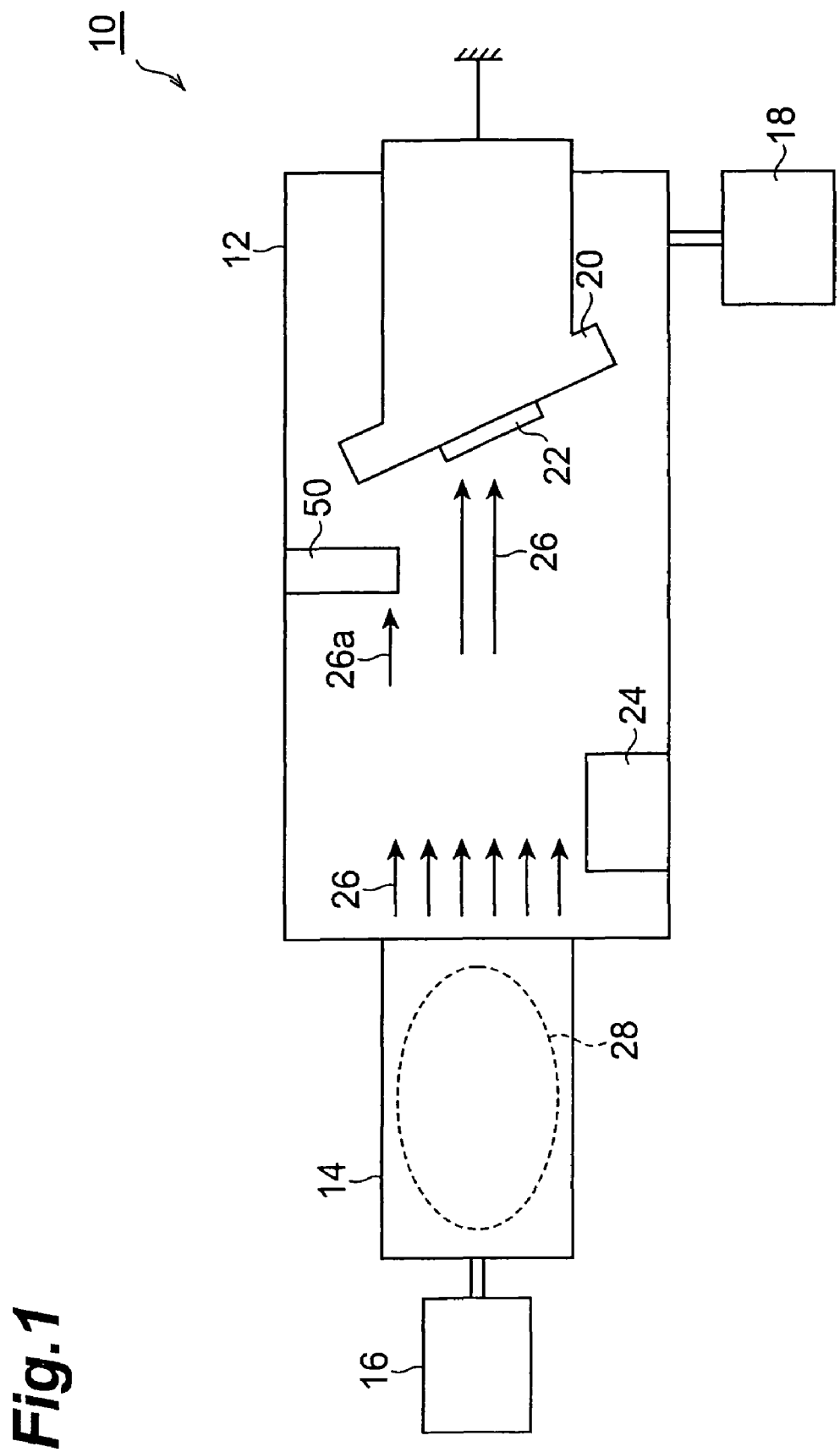
FIG. 1 is a figure schematically showing an ion beam etching apparatus according to a first embodiment.

Hereinafter, embodiments of the present invention are described in detail with reference to the attached drawings. It should be noted in the drawings that like reference characters are used to indicate the same or like elements, thus the overlapping explanations are omitted accordingly.

First Embodiment

FIG. 1 is a figure schematically showing an ion beam etching apparatus according to a first embodiment. The ion beam etching apparatus 10 shown in FIG. 1 comprises an ion source 14 which generates an ion beam 26 (beam of active species), and a chamber 12 which stores a substrate 22 (an object to be processed) which is irradiated with the ion beam 26. The ion beam 26 moves inside the chamber 12 and is irradiated onto the substrate 22. The substrate 22 is etched by the ion beam 26. The substrate 22 is supported by a grounded substrate holder 20. The substrate 22 is, for example, a silicon wafer. The ion beam 26 contains the cations of $Ar^+$ and the like, for example.

A gas supply source 16 which supplies gas for generating a plasma 28 is connected to the ion source 14. The plasma 28 is generated by, for example, applying high-frequency electricity to gas supplied from the gas supply source 16 into an electric discharge container, by means of a coil. The ion beam 26 is output by extracting the ions inside the plasma 28 by using, for example, an extraction electrode. A neutralizer 24 for neutralizing the ion beam 26 is set inside the chamber 12. For example, when the ion beam 26 contains the cations of $Ar^+$ and the like, electrons are emitted from the neutralizer 24. Furthermore, a vacuum pump 18 for maintaining the pressure inside the chamber 12 at predetermined pressure (0.05 Pa, for example) is connected to the chamber 12.

The ion beam etching apparatus 10 further comprises an etching depth measuring device 50 for measuring etching depth (etching depth) of the substrate 22 in real time, when using the ion beam 26 to etch the substrate 22. A part 26a of the ion beam 26 is irradiated onto the etching depth measuring device 50. It is preferred that the etching depth measuring device 50 be disposed in an appropriate position which hardly affects etching processing in the chamber 12. The etching depth measuring device 50 is suitably used as, for example, an etching end point detection device. For example, a point at which etching depth of the substrate 22, which is measured using the etching depth measuring device 50, reaches a predetermined value is judged as an end point of etching, and the etching processing is stopped at this point. Accordingly, etching processing can be stopped when desired etching depth is reached.

Figure 2:
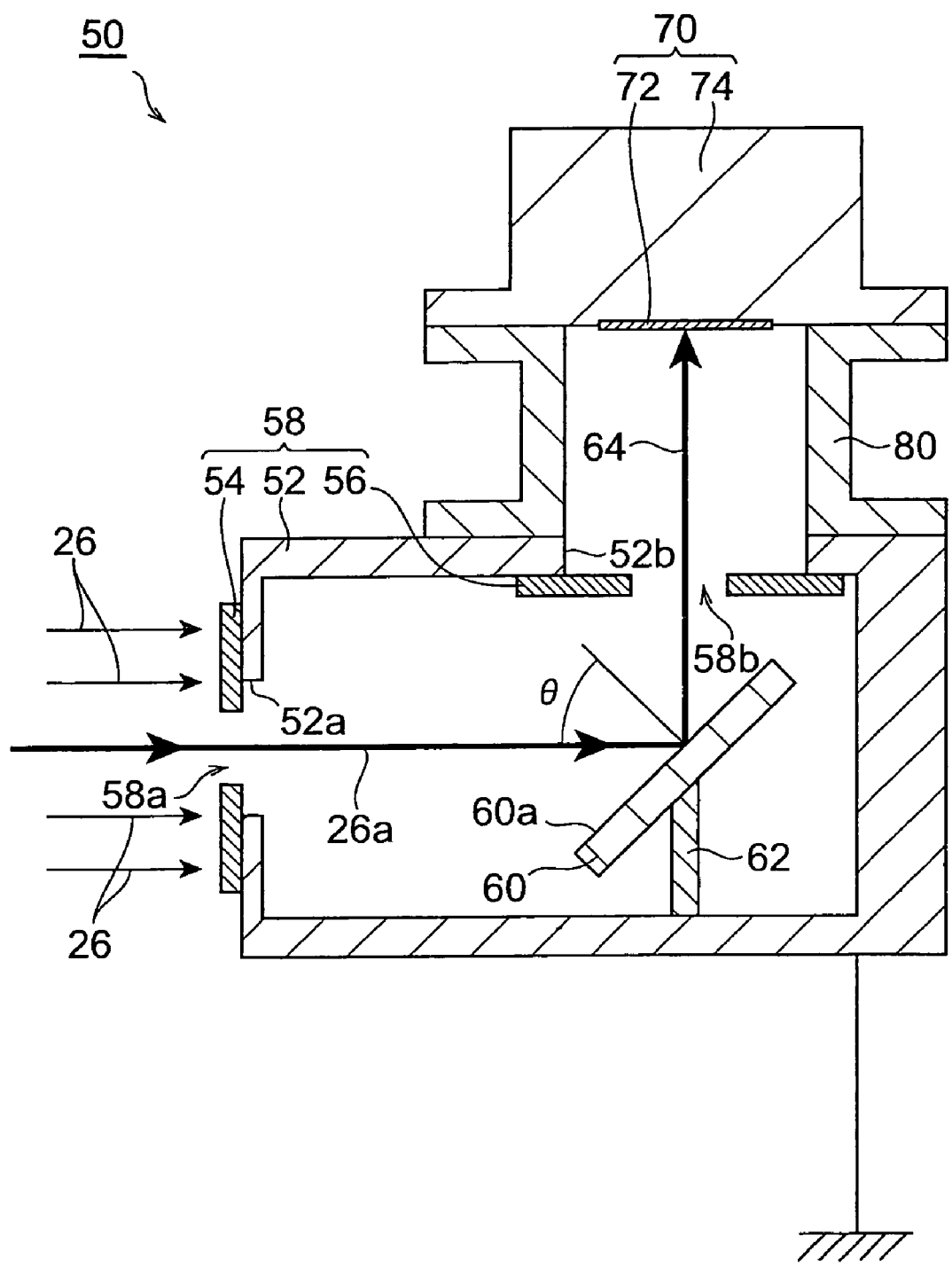
FIG. 2 is a cross-sectional view schematically showing an etching depth measuring device according to the first embodiment.

FIG. 2 is a cross-sectional view schematically showing the etching depth measuring device according to the first embodiment. The etching depth measuring device 50 shown in FIG. 2 has a chamber 58 in which is formed an introduction port 58a for introducing the part 26a of the ion beam 26, a member 60 to be processed which is stored in the chamber 58 and etched by the part 26a of the ion beam 26, and a mass detecting element 70 which receives substances 64 generated from the member 60 to be processed and detects the mass of the received substances 64. The substance 64 is a particle which is generated by, for example, spattering the member 60 to be processed.

In the ion beam etching apparatus 10 the substrate 22 and the member 60 to be processed are etched together, thus the etching depth of the substrate 22 and the etching depth of the member 60 to be processed are correlated with each other. Normally, the etching depth of the member 60 to be processed becomes large as the etching depth of the substrate 22 increases. Further, the etching depth of the member 60 to be processed and detected mass of the substances 64 are correlated with each other. Normally, the detected mass of the substances 64 becomes large as the etching depth of the member 60 to be processed increases. Therefore, the detected mass of the substances 64 and the etching depth of the substrate 22 are correlated with each other.

Therefore, according to the etching depth measuring device 50 of the present embodiment, the etching depth of the substrate 22 can be calculated from the detected mass of the substances 64 in real time by calculating a relational expression between the detected mass of the substances 64 and the etching depth of the substrate 22 beforehand.

It is preferred that the chamber 58 have a discharge port 58b for discharging the substances 64. In this case, it is preferred that the mass detecting element 70 be provided outside the chamber 58. Further, it is preferred that the etching depth measuring device 50 further comprise a short pipe 80 (pipe) connecting the discharge port 58b to the mass detecting element 70. The position of the mass detecting element 70 can be separated from the vicinity of the chamber 58 by this short pipe 80, thus an increase in temperature of the mass detecting element 70 caused by an increase in temperature of the chamber 58 can be constrained. Moreover, by adjusting, for example, the diameter of the discharge port 58b, the diameter of the short pipe 80, the length of the short pipe 80 and the like, the mass of the substances 64 reaching the mass detecting element 70 can be adjusted.

The chamber 58 comprises, for example, a casing 52 in which an opening 52a and an opening 52b are formed, an aperture 54 provided at the opening 52a, and an aperture 56 provided at the opening 52b. The chamber 58 is grounded, for example. The introduction port 58a is formed by the aperture 54. Since the aperture 54 can adjust the diameter of the introduction port 58a, amount of passage of the part 26a of the ion beam 26 (also called "ion beam flux") can be adjusted. The discharge port 58b is formed by the aperture 56. Since the aperture 56 can adjust the diameter of the discharge port 58b, amount of passage of the substances 64 can be adjusted. Moreover, the aperture 56 can prevent the substances 64 from adhering to an inner wall of the short pipe 80. As a result, maintenance of the etching depth measuring device 50 becomes simple.

It is preferred that the mass detecting element 70 have a member 72 in which the resonance frequency changes in response to a change in the mass of the received substances 64, and a sensor 74 which detects the resonance frequency of the member 72. In this case, the resonance frequency of the member 72 is changed when the substances 64 generated from the member 60 to be processed adhere to the member 72. The resonance frequency of the member 72 changes in response to, for example, the thickness of a film formed by accumulation of the substances 64 on the member 72. Therefore, by allowing the sensor 74 to detect a change of resonance frequency of the member 72, the mass of the substances 64 adhered to the member 72 can be detected.

It is preferred that the member 72 be a resonator such as a crystal resonator. In this case, the mass of the substances 64 that adhered to the member 72 can be detected with a high degree of accuracy.

Furthermore, it is preferred that the etching depth measuring device 50 further comprise an angle adjusting section 62 which supports the member 60 to be processed and adjusts an angle of incidence θ at which the part 26a of the ion beam 26 enters the member 60 to be processed. The angle of incidence θ is an angle formed by a traveling direction of the part 26a of the ion beam 26 and a normal line of a surface 60a to be processed of the member 60 to be processed. The angle adjusting section 62 can tilt the surface 60a to be processed of the member 60 to be processed.

By adjusting the angle of incidence θ, out of the substances 64 generated from the member 60 to be processed, the mass of the substances 64 reaching the mass detecting element 70 can be adjusted. As a result, the deposition rate of the film formed by accumulation of the substances 64 on the member 72 can be adjusted.

Moreover, since irradiation of the ion beam 26 to the etching depth measuring device 50 raises the temperature of the etching depth measuring device 50, it is preferred that the etching depth measuring device 50 be cooled by water-cooling means (not shown). By constraining the increase of the temperature of the etching depth measuring device 50, fluctuation of the speed of etching the member 60 to be processed can be controlled, and at the same time thermal effects on the mass detecting element 70 can be constrained.

It is preferred that the speed of etching the member 60 to be processed be higher than the speed of etching the substrate 22. In this case, it is easier to etch the member 60 to be processed than the substrate 22, thus the etching depth of the substrate 22 can be measured with a high degree of sensitivity. The speed of etching the member 60 to be processed is changed by selecting the material for the member 60 to be processed. By appropriately selecting the material, the maximum etching speed can be changed to be as much as approximately four times the minimum etching speed.

The speed of etching the member 60 to be processed may be the same as the speed of etching the substrate 22. In this case, the etching depth of the substrate 22 can be calculated easily. Further, the speed of etching the member 60 to be processed may be lower than the speed of etching the substrate 22. In this case, the lifetimes of the member 60 to be processed and member 72 are increased, thus the etching depth of the substrate 22 can be measured even more stably in the longer term.

Figure 3:
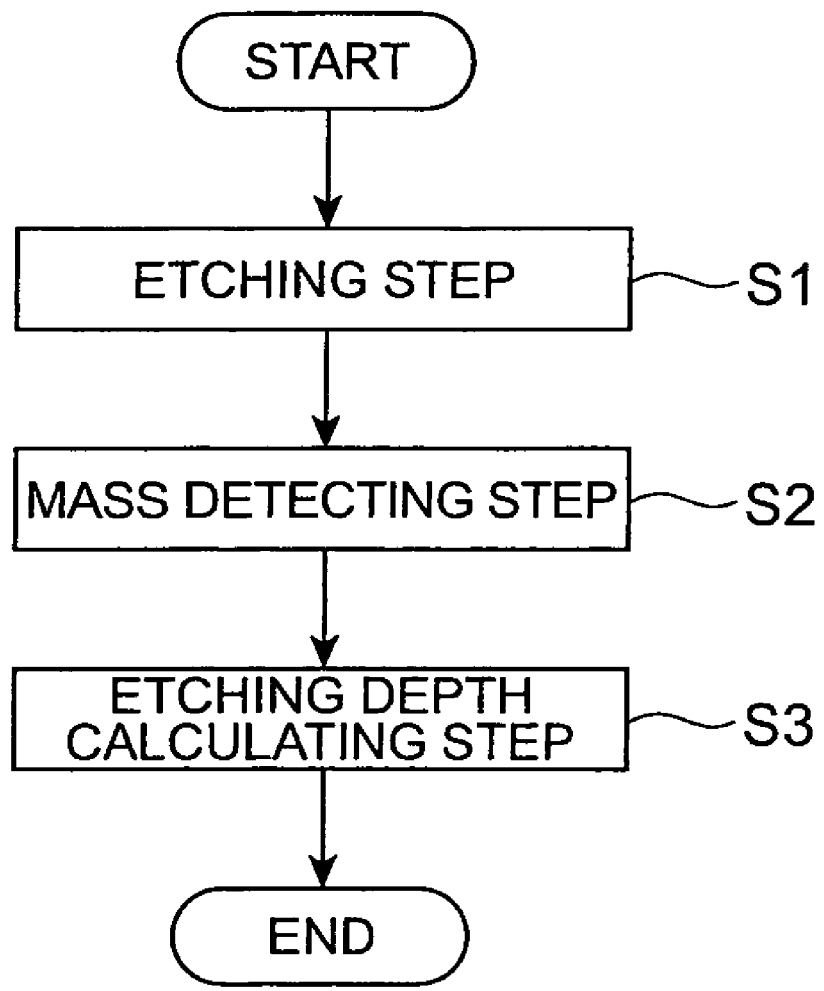
FIG. 3 is a flowchart showing each step of an etching depth measuring method according to the first embodiment.

FIG. 3 is a flowchart showing each step of an etching depth measuring method according to the first embodiment. The etching depth measuring method according to the present embodiment can be suitably executed by using the above-mentioned etching depth measuring device 50. The etching depth measuring method according to the present embodiment is a method of measuring the etching depth of the substrate 22 when etching the substrate 22 by means of the ion beam 26. Further, it is preferred that the following steps (a) through (c) be executed in this etching depth measuring method.

(Etching Step (a))

First, the substrate 22 is etched using the ion beam 26 and the member 60 to be processed is etched using the part 26a of the ion beam 26 (step S1).

(Mass Detecting Step (b))

Next, the substances 64 which are generated from the etched member 60 to be processed are received at the mass detecting element 70, and the mass of the received substances 64 is detected by the mass detecting element 70 (step S2).

(Etching Depth Calculation Step (c))

Next, the etching depth of the substrate 22 is calculated using the previously calculated relational expression between the detected mass of the substances 64 and the etching depth of the substrate 22 (step S3).

In the etching depth measuring method using the etching depth measuring device 50 and ion beam etching apparatus 10 of the present embodiment, there is no such a case where the laser beam is blocked by the particles accumulated on the polarization window. Therefore, the etching depth of the substrate 22 can be measured stably in the long term.

Furthermore, as a conventional etching depth measuring device, for example, there are known a method in which the electric current flowing to the extraction electrode of the ion source is measured to estimate ion beam current, and the etching depth is calculated from a value of the electric current flowing to the extraction electrode (referred to as "conventional method 1" hereinafter), and a method in which the electric current flowing to an object to be processed is measured to estimate ion beam current, and the etching depth is calculated from a value of the electric current flowing to the object to be processed (referred to as "conventional method 2" hereinafter).

In the conventional method 1, for example, an error occurs when estimating the ion beam current from the electric current flowing to the extraction electrode of the ion source. Moreover, since the error is not constant, the etching depth cannot be measured stably. Specifically, the cause of the error is considered as follows.

For example, a case in which an extraction electrode constituted with three electrode plates is used is considered. It should be noted that the electrode closest to the ion source is called "screen grid", the middle electrode is called "accelerator", and the electrode farthest from the ion source is called "decelerator". In this case, the value of the ion beam current is normally is obtained by subtracting the value of the electric current flowing to the accelerator, from a provisional value of the ion beam current, which is calculated using the electric current flowing to the screen grid and the aperture ratio of the screen grid. The decelerator is normally grounded, thus the electric current flowing to the decelerator cannot be measured.

Therefore, it is not known whether the ion beam current is reduced or not by the electric current flowing to the decelerator, when the ion beam passing through the accelerator contacts with the decelerator. How much of the ion beam contacts with the decelerator depends on voltage applied to the screen grid, voltage applied to the accelerator, the degree of vacuum inside the chamber, the amount of the current of the electron beam, the plasma density of the ion source, and the aperture ratio and position of the hole of each electrode plate constituting the extraction electrode. Therefore, the etching depth cannot be measured with a high degree of accuracy from the electric current flowing to the extraction electrode.

It should be noted that when using an extraction electrode constituted with, for example, two electrode plates, since there is no decelerator, instability of the ion beam current caused by the decelerator can be resolved. However, the ion beam which is output from the extraction electrode moves forward while decelerating between an object to be processed and the extraction electrode, thus the ion beam is diffused. The degree of diffusion also depends on, as described above, the voltage applied to the screen grid, the voltage applied to the accelerator, the degree of vacuum inside the chamber, the amount of the current of the electron beam, the plasma density of the ion source, and the aperture ratio and position of the hole of each electrode plate constituting the extraction electrode. Therefore, the etching depth cannot be measure with a high degree of accuracy in the conventional method 1.

In the conventional method 2, on the other hand, in order to measure the electric current flowing to an object to be processed, it is necessary to provide an electrical connection (contact) between the object to be processed and a substrate holder which holds the object to be processed. However, it is difficult to reliably obtain such contact every time. Moreover, electrons are introduced into the ion beam in order to constrain the charging of the object to be processed, thus the value of the electric current flowing to the object to be processed becomes zero ideally. Since the charging of the object to be processed actually cannot be neutralized completely, the electric current flowing to the object to be processed can be measured. However, since the value electric current flowing to the object to be processed is the thousandth part or less of the value of the ion beam current, thus the etching depth cannot be measured with a high degree of accuracy.

Moreover, in the conventional method 1 and the conventional method 2, there are a number of elements that cause temporal change such as staining of the etching apparatus, wear of the extraction electrode, and pattern fluctuation in the surface to be processed, thus the etching depth cannot measured with a high degree of accuracy.

On the other hand, the etching depth measuring method using the etching depth measuring device 50 and beam etching apparatus 10 of the present embodiment is different from the conventional method 1 and the conventional method 2, thus the etching depth can be measured with a high degree of accuracy.

Second Embodiment

Figure 4:
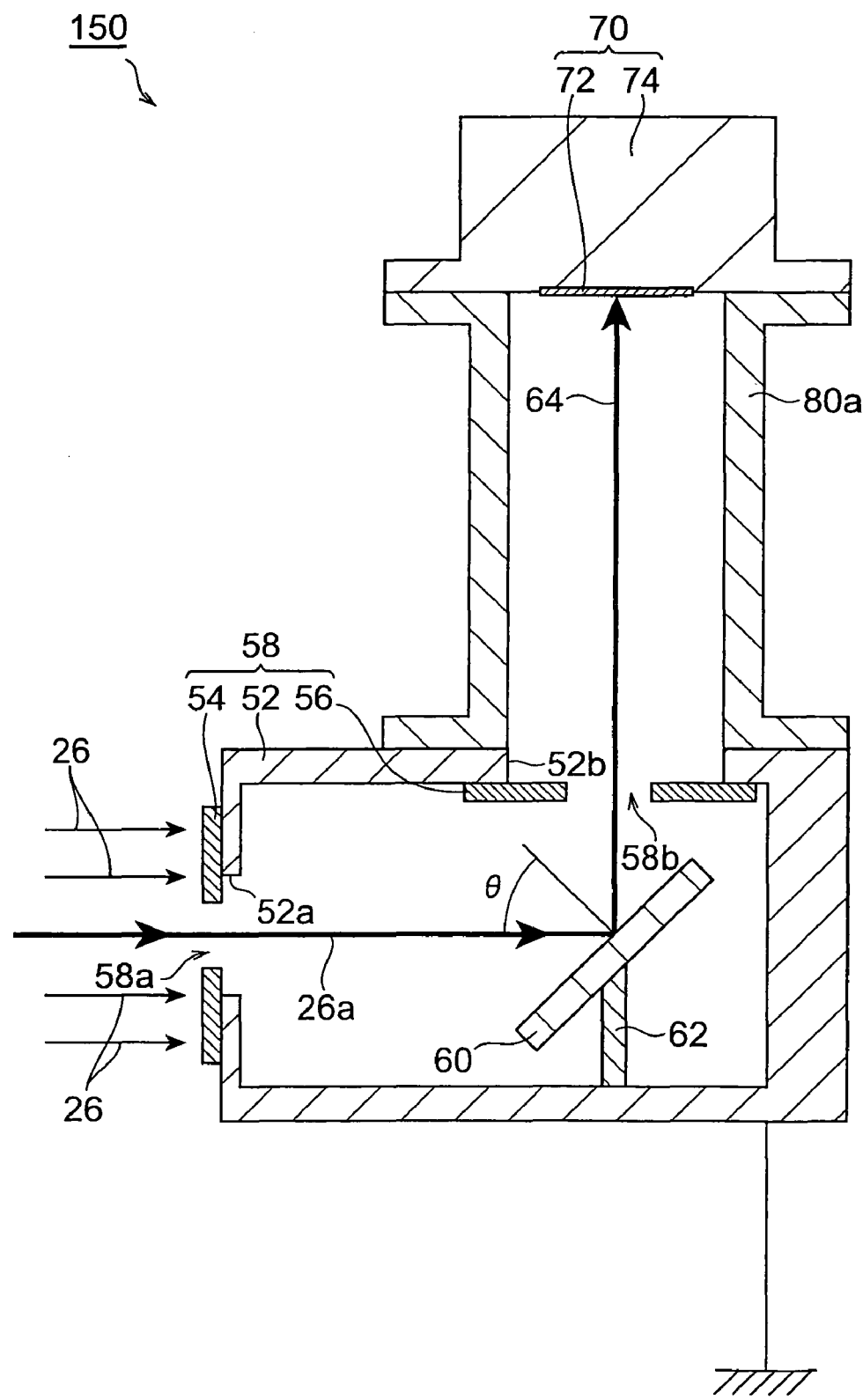
FIG. 4 is a cross-sectional view schematically showing the etching depth measuring device according to a second embodiment.

FIG. 4 is a cross-sectional view schematically showing the etching depth measuring device according to a second embodiment. The etching depth measuring device 150 shown in FIG. 4 has the similar configuration to the etching depth measuring device 50 of the first embodiment. When the etching depth measuring device 150 of the present embodiment is used in place of the etching depth measuring device 50 of the first embodiment, the similar operational effects to the first embodiment are obtained.

Moreover, in the-etching depth measuring device 150, the length of a short pipe 80a is longer than the short pipe 80 of the etching depth measuring device 50. For this reason, the position of the mass detecting element 70 can be separated more from the vicinity of the chamber 58 by the short pipe 80a, thus an increase in temperature of the mass detecting element 70 caused by an increase in temperature of the chamber 58 can be constrained even more.

Third Embodiment

Figure 5:
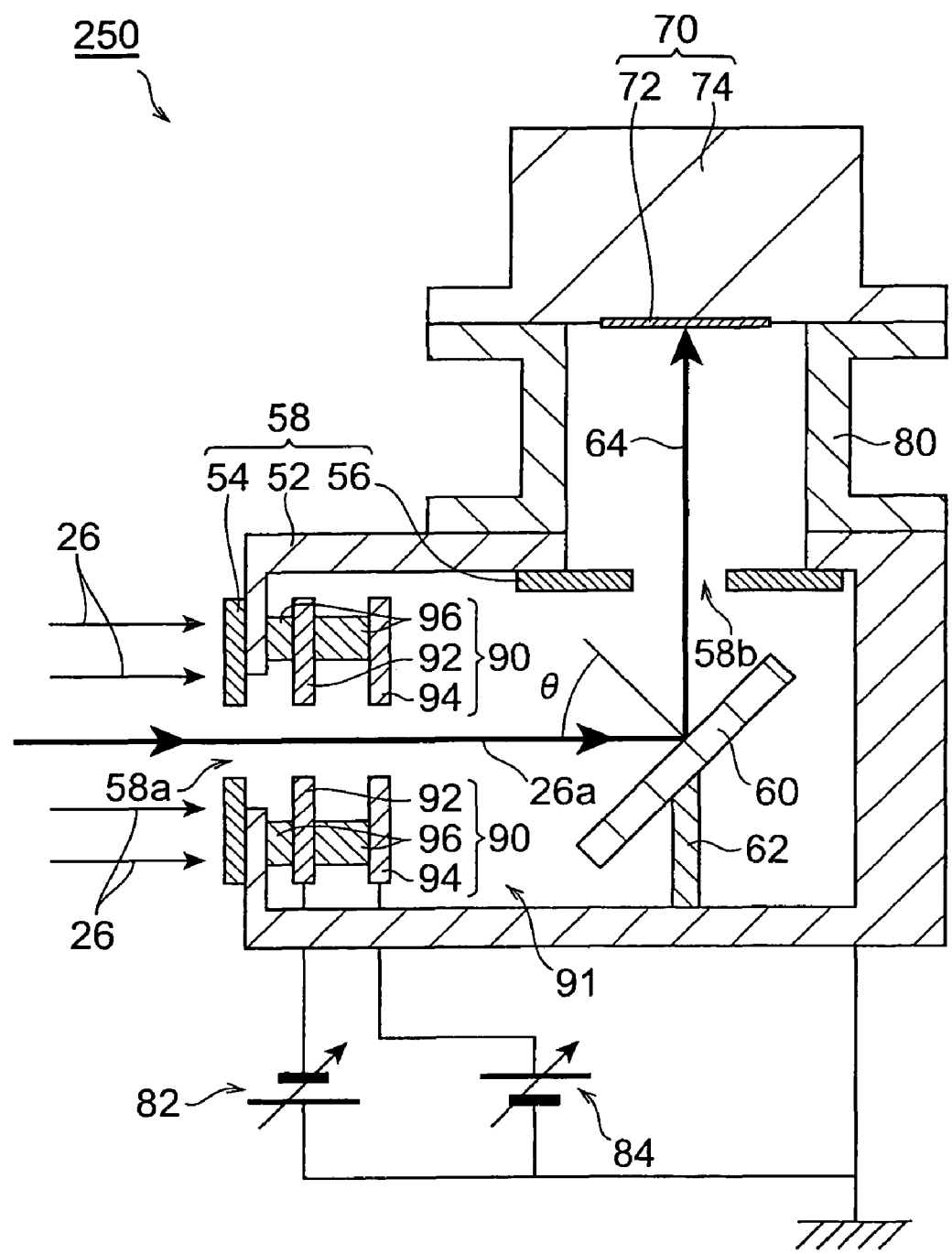
FIG. 5 is a cross-sectional view schematically showing the etching depth measuring device according to a third embodiment.

FIG. 5 is a cross-sectional view schematically showing the etching depth measuring device according to a third embodiment. The etching depth measuring device 250 shown in FIG. 5 further comprises, in addition to the configuration of the etching depth measuring device 50 of the first embodiment, an energy adjusting section 91 for adjusting the energy of the part 26a of the ion beam 26. Accordingly, the speed of etching the member 60 to be processed can be adjusted independently from the speed of etching the substrate 22, thus the mass of the substances 64 generated from the member 60 to be processed can be adjusted. The energy of the ion beam 26 is, for example, 1000 eV ($1.6 \times 10^{-16}$).

When, for example, the energy of the part 26a of the ion beam 26 is reduced using the energy adjusting section 91, the speed of etching the member 60 to be processed can be reduced, whereby the lifetime of the member 60 to be processed can be increased. Moreover, the deposition rate of the film formed by accumulation of the substances 64 on the member 72 can be reduced, thus exchange frequency of the member 72 can be reduced. When, for example, the member 72 is a crystal resonator, the member 72 is normally exchanged when the film thickness is 5 μm or less. Therefore, when performing etching at high speeds, it is desirable that the member 72 be replaced every time the processing is performed several ten to approximately a hundred times.

It is preferred that the energy adjusting section 91 have an electrode section 90 provided on a circumference of the introduction port 58a. In this case, voltage can be applied to the electrode section 90, thus the energy of the part 26a of the ion beam 26 which is introduced from the introduction port 58a into the chamber 58 can be adjusted. For example, in the case in which the part 26a of the ion beam 26 contains the cations, when applying positive voltage to the electrode section 90, the energy of the part 26a of the ion beam 26 can be reduced.

It is preferred that the electrode section 90 be provided inside the chamber 58. In this case, the aperture 54 of the chamber 58 also functions as a cover member for preventing the electrode section 90 from being exposed to the part 26a of the ion beam 26.

It is preferred that the electrode section 90 have a first electrode 92, and a second electrode 94 disposed between the electrode 92 and the member 60 to be processed. In this case, since different voltage can be applied to each electrode 92 and 94, the energy of the part 26a of the ion beam 26 can be adjusted easily by adjusting the each voltage. It is preferred that the electrode 92 be fixed to the chamber 58 via an insulating member 96. It is preferred that the electrode 94 be fixed to the electrode 92 via the insulating member 96.

It is preferred that a power source 82 be electrically connected to the electrode 92, and that a power source 84 be electrically connected to the electrode 94. Here, there is a case in which electrons are contained in, for example, the ion beam 26 in order to neutralize the space charge inside the ion beam 26 to prevent the ion beam 26 from diffusing. In this case, preferably the power source 82 can apply negative direct-current voltage to the electrode 92. When the negative voltage is applied to the electrode 92, for example, electrons contained in the part 26a of the ion beam 26 or a secondary electron which is generated by irradiating the ion beam 26 to the chamber 58, can be prevented from entering the chamber 58. Moreover, by applying the negative voltage to the electrode 92, a direct current discharge between the electrodes 92 and 94 can be constrained.

Further, when the part 26a of the ion beam 26 contains the cations, preferably the power source 84 can apply positive direct-current voltage to the electrode 94. When the positive voltage is applied to the electrode 94, an electrostatic field which is formed by the electrode 94 can reduce the energy of the part 26a of the ion beam 26.

When positive voltage of a predetermined value is applied to the electrode 94, for example, it is preferred that the value of the negative voltage applied to the electrode 92 be adjusted so that the electric current flowing to the electrode 94 becomes minimum.

It should be noted that when the etching depth measuring device 250 of the present embodiment is used in place of the etching depth measuring device 50 of the first embodiment, the similar operational effects to the first embodiment are obtained.

Fourth Embodiment

Figure 6:
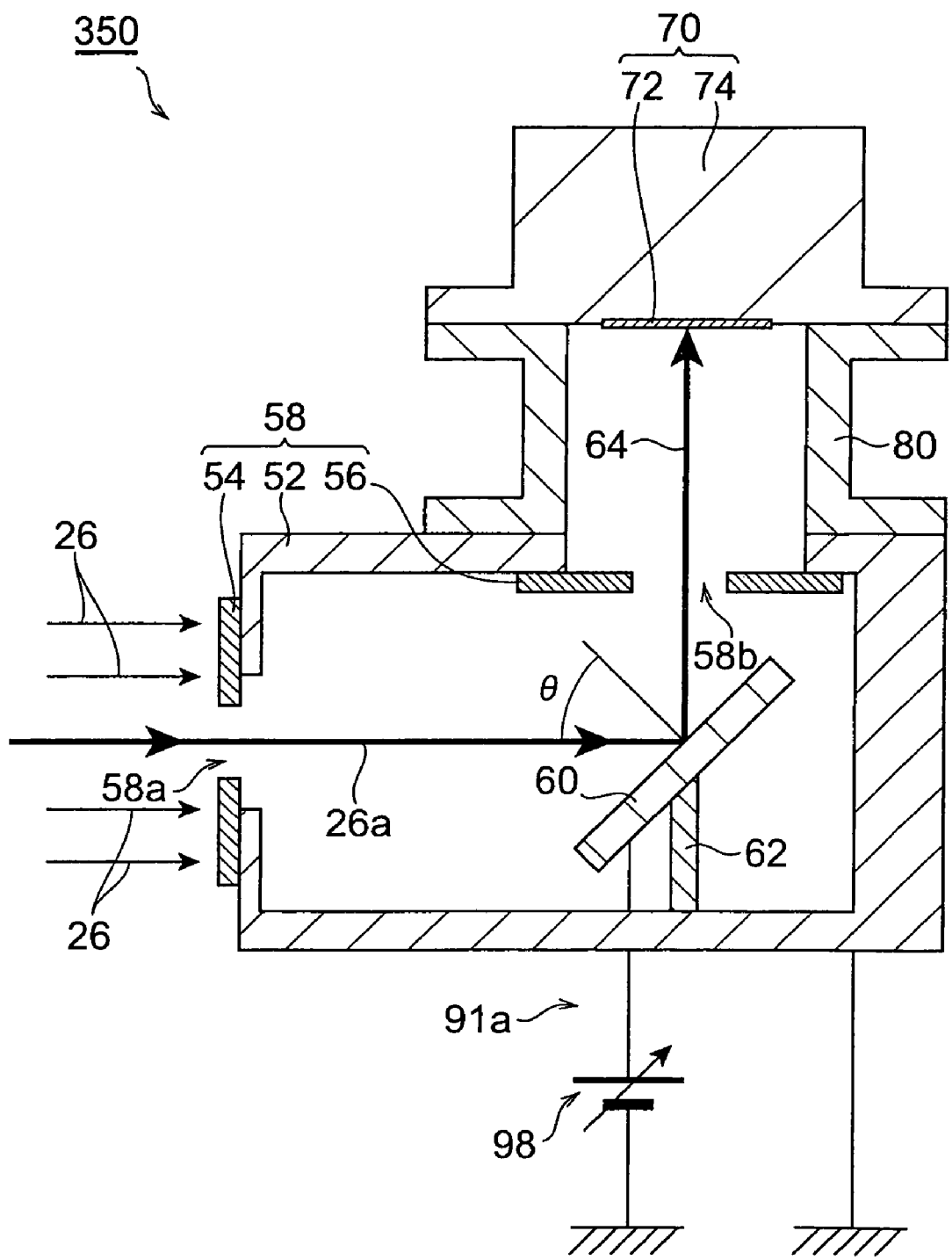
FIG. 6 is a cross-sectional view schematically showing the etching depth measuring device according to a fourth embodiment.

FIG. 6 is a cross-sectional view schematically showing the etching depth measuring device according to a fourth embodiment. The etching depth measuring device 350 shown in FIG. 6 further comprises, in addition to the configuration of the etching depth measuring device 50 of the first embodiment, an energy adjusting section 91*a* for adjusting the energy of the part 26*a* of the ion beam 26. It is preferred that the energy adjusting section 91*a* have a power source 98 which is electrically connected to the member 60 to be processed.

In the etching depth measuring device 350 of the present embodiment, the device configuration thereof is simple compared to that of the etching depth measuring device 250 of the third embodiment. Moreover, voltage can be applied to the member 60 to be processed, the energy of the part 26*a* of the ion beam 26 which enters the member 60 to be processed can be adjusted. For example, when the cations are contained in the part 26*a* of the ion beam 26, preferably the power source 98 can apply positive voltage to the member 60 to be processed. When the positive voltage is applied to the member 60 to be processed, the energy of the part 26*a* of the ion beam 26 which enters the member 60 to be processed can be reduced.

It should be noted that when the etching depth measuring device 350 of the present embodiment is used in place of the etching depth measuring device 50 of the first embodiment, the similar operational effects to the first embodiment are obtained. In addition, the energy adjusting section 91*a* may have the electrode section 90 shown in FIG. 5.

Fifth Embodiment

Figure 7:
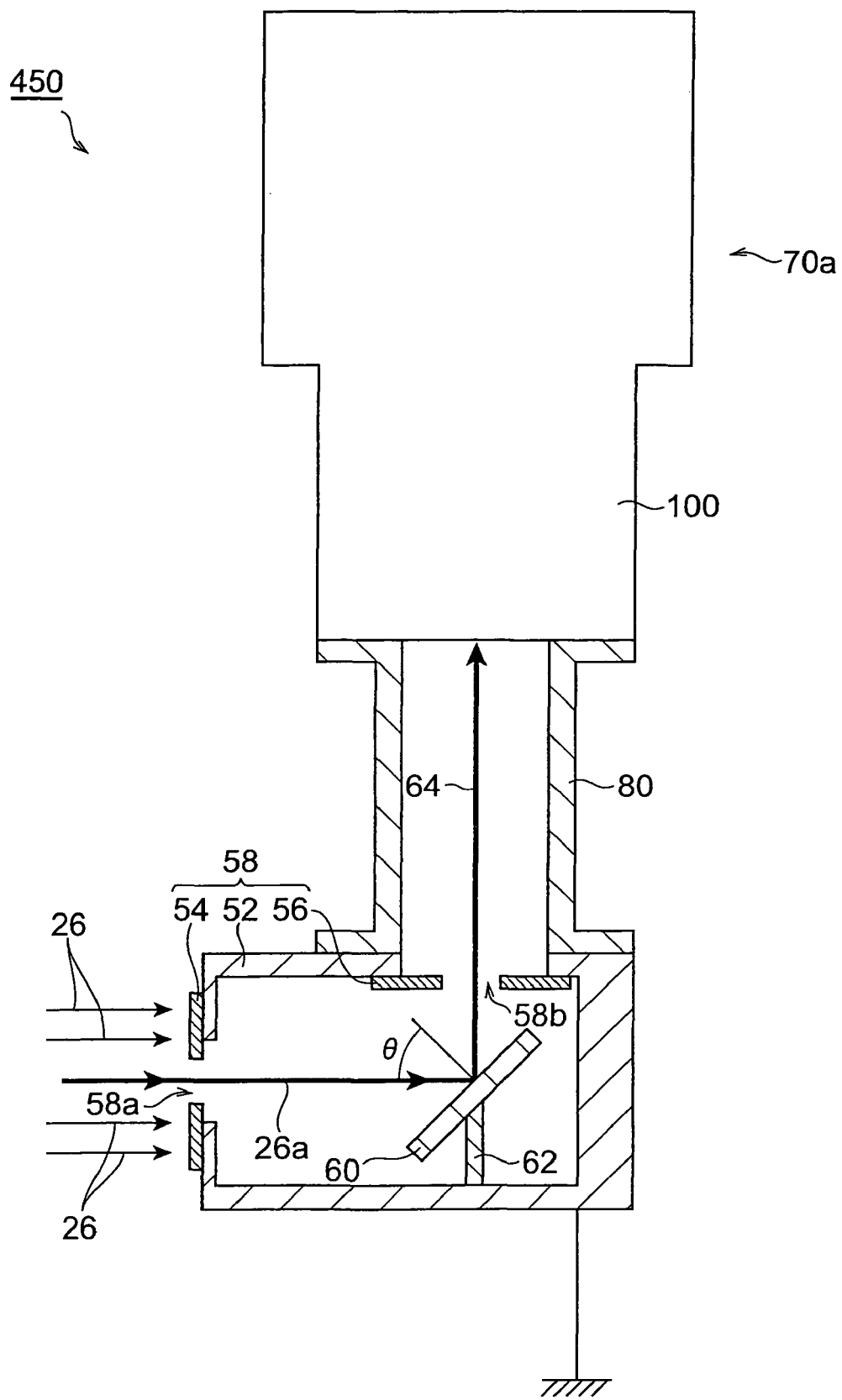
FIG. 7 is a cross-sectional view schematically showing the etching depth measuring device according to a fifth embodiment.

FIG. 7 is a cross-sectional view schematically showing the etching depth measuring device according to a fifth embodiment. The etching depth measuring device 450 shown in FIG. 7 comprises a mass detecting element 70*a* instead of the mass detecting element 70 of the etching depth measuring device 50 of the first embodiment. It is preferred that the mass detecting element 70*a* have a mass spectrometer 100 which detects the mass of the received substances 64. In this case, even when the received substances 64 are in minute amounts, the mass of the substances 64 can be detected with a high degree of accuracy. Therefore, compared to the case in which the mass detecting element 70 is used, the member 60 to be processed which is etched at low speeds can be used.

It should be noted that when the etching depth measuring device 450 of the present embodiment is used in place of the etching depth measuring device 50 of the first embodiment, the similar operational effects to the first embodiment are obtained. In addition, the etching depth measuring device 450 may further comprise the energy adjusting section 91*a*.

Although the preferred embodiments of the present invention have been described in detail above, the present invention is not limited to these embodiments.

For example, the active species inside the plasma are not limited to ions, and thus may be radicals or the like. Further, the active species inside the plasma do not have to form a beam.

Moreover, each of the etching depth measuring devices according to the first through fifth embodiments may be used in, for example, a plasma etching apparatus or the like.

According to the present invention, an etching depth measuring device, etching apparatus, and etching depth measuring method capable of measuring the etching depth of an object to be processed, stably in the long term, are provided.

What is claimed is:

1. An etching depth measuring device for measuring an etching depth of a substrate being processed, where the etching of the substrate uses active species present in a plasma of an ion beam from an ion beam source, the etching depth measuring device comprising:
    a second chamber contained in a first chamber;
    the second chamber having a port for introducing a part of the active species from the plasma of the ion beam while remaining part of the active species being used to process the substrate in the first chamber;
    a member housed in the second chamber and sputtered etched by the part of the active species from the plasma of the ion beam; and
    a mass detecting element which receives a substance generated from the member by sputtering to detect mass of the received substance, wherein the second chamber and the substrate being processed are contained in the first chamber and the first chamber has a port for attaching the source of the ion beam,
    the substrate and the member are etched simultaneously by the ion beam from the source, and a calculation module to calculate etch depth of the substrate on the basis of mass received by the mass detecting element in the second chamber.

2. The etching depth measuring device according to claim 1, wherein the mass detecting element comprises a member in which a resonance frequency changes in response to a change in the mass of the received substance, and a sensor which detects the resonance frequency of the member.

3. The etching depth measuring device according to claim 1, wherein the mass detecting element comprises a mass spectrometer which detects the mass of the received substance.

4. The etching depth measuring device according to claim 1,
    further comprising an angle adjusting section which supports the member to be sputtered etched and adjusts an angle of incidence at which the part of the active species diffuses to the member to be sputtered etched.

5. The etching depth measuring device according to claim 1,
    wherein a speed of etching the member to be sputtered etched is higher than a speed of etching the substrate to be processed.

6. The etching depth measuring device according to claim 1, further comprising an energy adjusting section for adjusting energy of the part of the active species.

7. The etching depth measuring device according to claim 6, wherein the energy adjusting section comprises an electrode section provided on a circumference of the introduction port.

8. The etching depth measuring device according to claim 7,
    wherein the electrode section comprises a first electrode and a second electrode which is disposed between the first electrode and the member to be sputtered etched sputtered etched.

9. The etching depth measuring device according to claim 6,
    wherein the energy adjusting section comprises a power source which is electrically connected to the member to be sputtered etched.

10. The etching depth measuring device according to claim 1, wherein the second chamber comprises a discharge port for discharging the substance, wherein the mass detecting element is provided outside the second chamber, and wherein the etching depth measuring device further comprises a pipe for connecting the discharge port to the mass detecting element.

11. An etching depth measuring device of claim 1, wherein the ion beam source is closer to the member than to the substrate.

12. An etching apparatus comprising an etching depth measuring device for measuring an etching depth of a substrate being processed, where the etching of the substrate uses active species present in a plasma of an ion beam from an ion beam source, the etching depth measuring device comprising:

a second chamber contained in a first chamber;

the second chamber having a port for introducing a part of the active species from the plasma of the ion beam while remaining part of the active species being used to process the substrate in the first chamber;

a member housed in the second chamber and sputtered etched by the part of the active species from the plasma of the ion beam; and a mass detecting element which receives a substance generated from the member by sputtering to detect mass of the received substance, wherein the second chamber and the substrate being processed are contained in the first chamber and the first chamber has a port for attaching the source of the ion beam, the substrate and the member are etched simultaneously by the ion beam from the source, and a calculation module to calculate etch depth of the substrate on the basis of mass received by the mass detecting element in the second chamber.

13. An etching apparatus of claim 12, wherein the ion beam source is closer to the member than to the substrate.

* * * * *